: US009602895B2

United States Patent
Bowling et al.

(10) Patent No.: US 9,602,895 B2
(45) Date of Patent: Mar. 21, 2017

(54) INTEGRATED CIRCUIT DEVICE WITH TAMPER DETECTION INPUT AND HAVING REAL TIME CLOCK CALENDAR LOGGING THEREOF

(71) Applicant: Microchip Technology Incorporated, Chandler, AZ (US)

(72) Inventors: Stephen Bowling, Chandler, AZ (US); Michael Simmons, Chandler, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 129 days.

(21) Appl. No.: 14/538,253

(22) Filed: Nov. 11, 2014

(65) Prior Publication Data

US 2015/0130636 A1    May 14, 2015

Related U.S. Application Data

(60) Provisional application No. 61/903,979, filed on Nov. 14, 2013.

(51) Int. Cl.
 *H04Q 9/00* (2006.01)
 *G01R 22/06* (2006.01)
 *G08B 13/00* (2006.01)

(52) U.S. Cl.
 CPC .............. *H04Q 9/00* (2013.01); *G01R 22/066* (2013.01); *G08B 13/00* (2013.01)

(58) Field of Classification Search
 CPC combination set(s) only.
 See application file for complete search history.

(56) References Cited

U.S. PATENT DOCUMENTS 5,243,654 A * 9/1993 Hunter .................. G06Q 20/401
                              380/51
6,885,309 B1 * 4/2005 Van Heteren .......... G08C 15/06
                             340/540

(Continued)

FOREIGN PATENT DOCUMENTS

EP         0969346 A2    1/2000    ........... G06F 21/00
WO    2004/034069 A1   4/2004    ........... G01D 4/00

(Continued)

OTHER PUBLICATIONS

International Search Report and Written Opinion, Application No. PCT/US2014/065150, 12 pages, Feb. 25, 2015.

*Primary Examiner* — Kabir A Timory
(74) *Attorney, Agent, or Firm* — Slayden Grubert Beard PLLC

(57) ABSTRACT

If an enclosure of a metering device is opened or vandalized, application software must determine when the metering history information became unreliable, and further notification to the utility may be desirable. Likewise, a shipping container or suitcase that has been opened or mishandled during shipping transient may be attributed to a particular location and/or handling person(s) when the time and date of the mishandling occurrence are known. A transition on a special device input from a tamper or mishandling sensor captures real-time clock/calendar (RTCC) information that provides to a software application the time and date of the detected tampering or mishandling event. This transition may also cause memory storage of the RTCC information related to the event. Thus, an integrated circuit device, for example a microcontroller or any other integrated circuit device may comprise such an RTCC and external input, and, optionally, memory storage of the RTCC event occurrence.

25 Claims, 4 Drawing Sheets

(56) References Cited

U.S. PATENT DOCUMENTS

| | | | |
|---|---|---|---|
| 2008/0001594 A1 | 1/2008 | Youssef | 324/110 |
| 2009/0195394 A1 | 8/2009 | Johnson et al. | 340/584 |
| 2010/0036624 A1 | 2/2010 | Martin et al. | 702/61 |
| 2012/0053869 A1* | 3/2012 | Owen | G01R 22/063 702/62 |

FOREIGN PATENT DOCUMENTS

| | | | |
|---|---|---|---|
| WO | 2009/044355 A2 | 4/2009 | G06F 21/725 |
| WO | 2013/116441 A1 | 8/2013 | G04F 10/10 |

* cited by examiner

INTEGRATED CIRCUIT DEVICE WITH TAMPER DETECTION INPUT AND HAVING REAL TIME CLOCK CALENDAR LOGGING THEREOF

RELATED PATENT APPLICATION

This application claims priority to commonly owned U.S. Provisional Patent Application Ser. No. 61/903,979; filed Nov. 14, 2013; is hereby incorporated by reference herein for all purposes.

TECHNICAL FIELD

The present disclosure relates to integrated circuit devices, in particular to a peripheral having a tamper detection input and real time clock and calendar (RTCC) time stamping when a tamper event is detected.

BACKGROUND

Metering of gas, electricity and water must ensure that the usage data collected is valid for customer billing purposes. If a metering device has been tampered with, e.g., opened or vandalized, the billing information may not be correct thereafter. Meter tampering may be shunting of current measuring devices in an electric meter, bypassing or altering the flow measuring device in gas and water meters, etc.

Tampering and/or mishandling of shipping containers, e.g., boxes, suitcases, and the like, may occur during shipping transient but what happened and when it happened generally is a mystery. Thus when there are multiple shippers involved, responsibility on who is to blame may be hard to determine and collection for damages equally difficult.

SUMMARY

Therefore a need exists for determining when a metering device has been tampered with, or a shipping container has been tampered with or mishandled.

According to an embodiment, an integrated circuit device may comprise: a real time clock and calendar (RTCC) circuit configured to be coupled with an external power source; a time stamp capture register coupled with the RTCC; and an external input coupled with the time stamp capture register for receiving an event signal that may initiate capture of time and date information provided by the RTCC into the time stamp capture register.

According to a further embodiment, the time stamp capture register may be non-volatile. According to a further embodiment, the time stamp capture register has secured access thereto. According to a further embodiment, a false trigger filter may be coupled between the external input and the time stamp capture register. According to a further embodiment, the false trigger filter may comprise a low pass filter. According to a further embodiment, the false trigger filter may comprise a digital sampling and averaging filter. According to a further embodiment, the time stamp capture register may be a plurality of time stamp capture registers. According to a further embodiment, a plurality of false trigger filters may be provided, wherein each of the plurality of false trigger filters may be coupled to a respective one of the plurality of time stamp capture registers. According to a further embodiment, the RTCC, the time stamp capture register, the external input, and the false trigger filter may be powered by a continuous power source.

According to a further embodiment, the continuous power source may be a battery. According to a further embodiment, an application circuit and a communications interface may be coupled with the RTCC and the time stamp capture register. According to a further embodiment, the RTCC, time stamp capture register, and application circuit may be provided by a microcontroller. According to a further embodiment, the event signal may be a tamper signal from a tamper sensor. According to a further embodiment, the tamper sensor may be selected from the group consisting of a pressure activated switch, a magnetically activated switch, a mechanically activated switch, a Hall effect magnetic sensor, a pressure transducer, and a capacitive proximity sensor. According to a further embodiment, the event signal may be a mishandling signal from a mishandling sensor. According to a further embodiment, the mishandling sensor may be selected from the group consisting of an acceleration sensor, a vibration sensor, a tilt sensor, a temperature sensor, a moisture sensor, a pressure sensor, a humidity sensor, an ultraviolet sensor, an infrared sensor, a radiation sensor, and an altitude sensor.

According to another embodiment, a metering device having tamper detection may comprise: a meter housing; a process metering sensor in the meter housing; a tamper sensor for detecting tampering of the meter housing; and an integrated circuit device in the meter housing and may comprise a real time clock and calendar (RTCC) circuit that may be configured to be coupled with an external power source; a time stamp capture register coupled with the RTCC, an external input coupled with the time stamp capture register for receiving a signal from the tamper sensor that initiates capture of time and date information provided by the RTCC into the time stamp capture register, and an application circuit coupled to the process metering sensor and the time stamp capture register.

According to a further embodiment, the metering device may be a utility meter. According to a further embodiment, the utility meter may be selected from the group consisting of an electric power meter, a natural gas meter, a propane meter, and a water meter.

According to yet another embodiment, a shipping container having mishandling detection may comprise: a storage housing; a mishandling sensor for detecting mishandling of the storage housing; and an integrated circuit device in the storage housing and may comprise a real time clock and calendar (RTCC) circuit configured to be coupled with an external power source; a time stamp capture register coupled with the RTCC, and an external input coupled with the time stamp capture register for receiving a signal from the mishandling sensor that initiates capture of time and date information provided by the RTCC into the time stamp capture register.

According to a further embodiment, the mishandling sensor may be selected from the group consisting of an acceleration sensor, a vibration sensor, a tilt sensor, a temperature sensor, a moisture sensor, a pressure sensor, a humidity sensor, an ultraviolet sensor, an infrared sensor, and an altitude sensor. According to a further embodiment, the storage housing may be an intermodal steel container. According to a further embodiment, the storage housing may be a shipping box. According to a further embodiment, the storage housing may be a suitcase.

According to still another embodiment, an electronic device having non-volatile memory that may be erased when unauthorized access of the electronic device may be detected and may comprise: a digital processor; a non-volatile memory coupled with the digital processor; a tamper sensor;

a real time clock and calendar (RTCC) circuit configured to be coupled with an external power source; a time stamp capture register coupled with the RTCC and having an input coupled to the tamper sensor, wherein when a tamper signal may be received from the tamper sensor the time stamp capture register stores time and date information provided by the RTCC; and the tamper signal also initiates the digital processor to erase data from the non-volatile memory.

According to a further embodiment, the non-volatile memory may be a hard disk. According to a further embodiment, the electronic device may be selected from the group consisting of a personal computer, a tablet computer, a smart phone, and a bank ATM.

BRIEF DESCRIPTION OF THE DRAWINGS

A more complete understanding of the present disclosure may be acquired by referring to the following description taken in conjunction with the accompanying drawings wherein.

Figure 1:
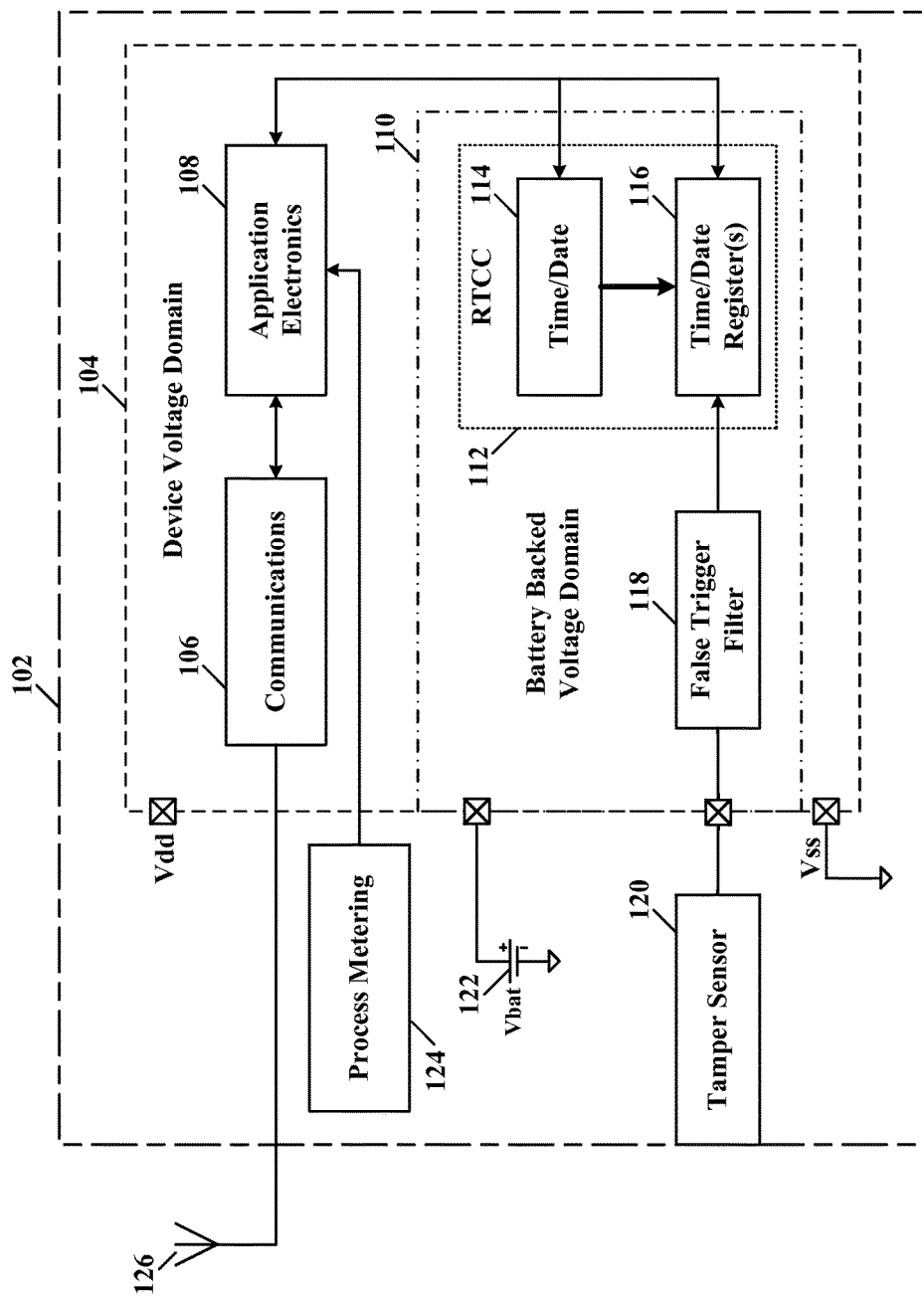
FIG. 1 illustrates a schematic block diagram of a metering device having a tamper sensor and real time clock and calendar (RTCC) time stamping, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Tamper detection is necessary when a metering device supplies billing information or a shipping container or suitcase is mishandled so that proper corrective actions may be taken for verifying the integrity of the billing information, or determining who is at fault for the mishandling of the shipping container or suitcase. For example, in metering applications for electricity, gas, and water, these devices must ensure that the data collected is valid for customer billing purposes. If the enclosure of the metering device is opened or vandalized, the application software must determine when the metering history information became unreliable, and further notification to the utility may be desirable. Likewise, a shipping container or suitcase that has been opened or mishandled during shipping transient may be attributed to a particular location and/or handling person(s) when the time and date of the mishandling occurrence are known.

For example, energy meters and other 'money tracking' devices must ensure data is valid. Examples for tampering are bypassing current shunts in an electric meter or the blocking of a paddle wheel sensor in a water meter. Other requirements are that these applications must run basically substantially forever on minimal battery power. For example, a meter unit may sit on a shelf for a long time prior to installation/commissioning.

According to various embodiments, a transition on a special device input (pin), captures real-time clock/calendar (RTCC) information that may provide to a software application the time and date of the detected tampering or mishandling event. This transition may also cause memory storage of the RTCC information related to the event. Thus, an integrated circuit device, for example a microcontroller or any other integrated circuit device may comprise such an RTCC and external input (pin), and, optionally, memory storage of the RTCC event occurrence.

Microcontrollers, such as PIC microcontrollers manufactured by Applicant, may have a separate, battery-backed voltage domain. For example, a small portion of the device circuitry remains active, while the rest of integrated circuit device may be shut down (Deep Sleep). The Real Time Clock/Calendar (RTCC) may be included on this battery-backed voltage domain and remain functional at all times.

According to various embodiments, the RTCC may be modified to include capture registers for RTCC time and date. Furthermore, at least one external input pin may be provided to activate the RTCC time/date capture. The at least one external input pin may be powered from the alternate voltage domain, if available. The at least one input pin may be connected to external switches, sensors, etc., that indicate mechanical or electrical tampering. If time/date capture of a tampering event occurs, the billing application may determine the last time at which data may be considered valid. Knowing the time/date of a tampering or mishandling event may facilitate where and who was handling a package or suitcase, and how badly the package or suitcase was mistreated. A plurality of tampering/mistreatment inputs may be provided for coupling to tampering sensors at various locations, or mistreatment sensors having various degrees of punishment and abuse measurement to the package or suitcase, e.g., g-force sensors of different g-force trip values, etc. The word "tampering" used herein shall also include any unauthorized access, mistreatment, abuse, rough handling, or subjection to damaging heat, vibration, water intrusion, radiation, sunlight, and the like.

Referring now to FIG. 1, depicted is a schematic block diagram of a metering device having a tamper sensor and real time clock and calendar (RTCC) time stamping, according to a specific example embodiment of this disclosure. A metering device 102 may comprise a process metering sensor 124 coupled to applications electronics 108, a tamper sensor 120, optionally coupled to a false trigger filter 118, and a real time clock and calendar (RTCC) 112 comprising a time/date clock 114, and at least one time/date capture (or hereinafter "time stamp capture") register 116 for storing a time/date from the RTCC 114. When a tamper event occurs the tamper sensor 120 triggers storage of the time and date of the tamper event occurrence in the at least one time stamp capture register 116. The least one time stamp capture register 116 may be a plurality of time stamp capture registers 116, e.g., a memory pushdown stack. The time stamp capture register 116 may be non-volatile and may be a register with secured or encrypted access.

A microcontroller unit (MCU) 104 may contain at least one instance of a real-time-clock and calendar (RTCC)

peripheral 110, optionally having a false trigger filter 118. The RTCC peripheral 110 may operate on the same, or a different power domain than the rest of the MCU 104, making it operational at all times. The tamper detect input 128 may operate on the same power domain as the RTCC peripheral 110. Therefore, the two may function together for very low power tampering detection.

In the case of the latter, the RTCC 112 and a limited amount of device circuitry, e.g., false trigger filter 118, typically operate from a small battery 122 in the metering device 102. This allows time keeping while the rest of the MCU 104 is powered down, e.g., low power sleep mode. The RTCC 112 accepts a time stamp input from the tamper sensor 120 that initiates the data capture (time and date of tamper event occurrence). The time stamp input may be supplied from an input pin 128 that remains powered when the RTCC peripheral 110 is powered from the battery 122. The time stamp register 116 may be a non-volatile register, for example, a non-volatile register with secure access to avoid further tampering with the captured data. For example, a password access scheme may be implemented. Other secure access means may be employed. It is contemplated and within the scope of this disclosure that wireless communications may be provided with a communications interface 106 and antenna 126 from the applications electronics 108 that is coupled to the at least one time stamp register 116 and time/date clock 114. Therefore a remote service programmer may read the contents of the at least one time stamp register 116, then reset same after reading its contents, and may also be used to set the RTCC 114 to a correct time and date. Communications may be any one of a number of wireless protocols, e.g., Bluetooth®, Zigbee®, Wi-Fi, BodyCom® and the like. An RFID device (not shown) may be coupled to the time/date stamp register(s) 116 for content readout thereof. Bluetooth® is a registered trademark of Bluetooth Sig, Inc., Suite 350 5209, Lake Washington Boulevard, Kirkland, Wash. 98033. Zigbee® is a registered trademark of ZigBee Alliance, 2400 Camino Ramon, Suite 375, San Ramon, Calif. 94583. BodyCom® is a registered trademark of Microchip Technology Incorporated, 2355 West Chandler Boulevard, Chandler, Ariz. 85224-6199.

The tamper input 128 optionally may have a false trigger input filter 118 to substantially eliminate false triggers. The tamper input 128 may be connected to some type of switch contacts, loss of pressure switch, etc., or other type of sensor that may be part of the metering application hardware. A signal from the tamper sensor 120 to the tamper input 128 may indicate mechanical tampering with the metering application enclosure. When a transition is detected on the tamper input 128, the current time and date may be captured in the at least one time/date stamp register 116. The captured time/date stamp data provides the last known time and date at which the data may be considered valid.

The false trigger filter 118 may be as simple as a combination of a resistor(s) and a capacitor(s) configured as a low pass filter to substantially reduce noise spikes from appearing as a false tamper event. The false trigger filter 118 may also comprise a digital filter taking a plurality of samples of the tamper sensor 120 output then averaging these samples over time to indicate whether a tamper event has occurred.

Figure 2:
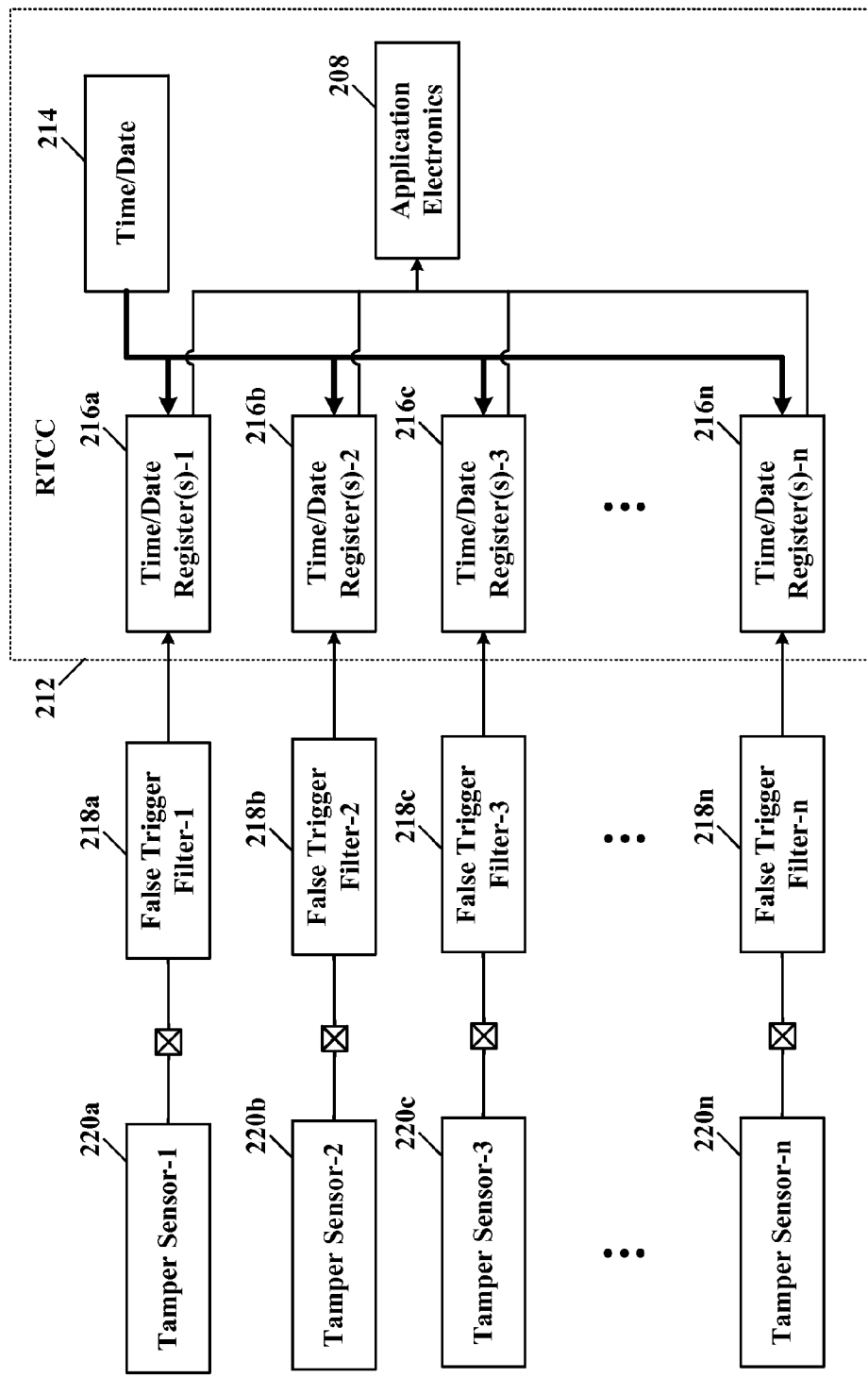
FIG. 2 illustrates a partial schematic block diagram of a metering device having a plurality of tamper sensors and RTCC time stamping, according to another specific example embodiment of this disclosure.

Referring to FIG. 2, depicted is a partial schematic block diagram of a metering device having a plurality of tamper sensors and RTCC time/date stamping, according to another specific example embodiment of this disclosure. A metering device as described hereinabove may comprise a plurality of tamper sensors 220, false trigger filters 218, time/date stamp registers 216, a time/date clock 214 and application electronics 208. A communications interface (106 in FIG. 1) and housing 102 are not shown but are contemplated herein. Each of the time/date stamp registers 216 may comprise a plurality of memory registers, e.g., push down stacks memory, for storing a plurality of tamper events. Thus, more than one tamper sensor 220 may be used for backup and redundancy in critical metering applications.

Figure 3:
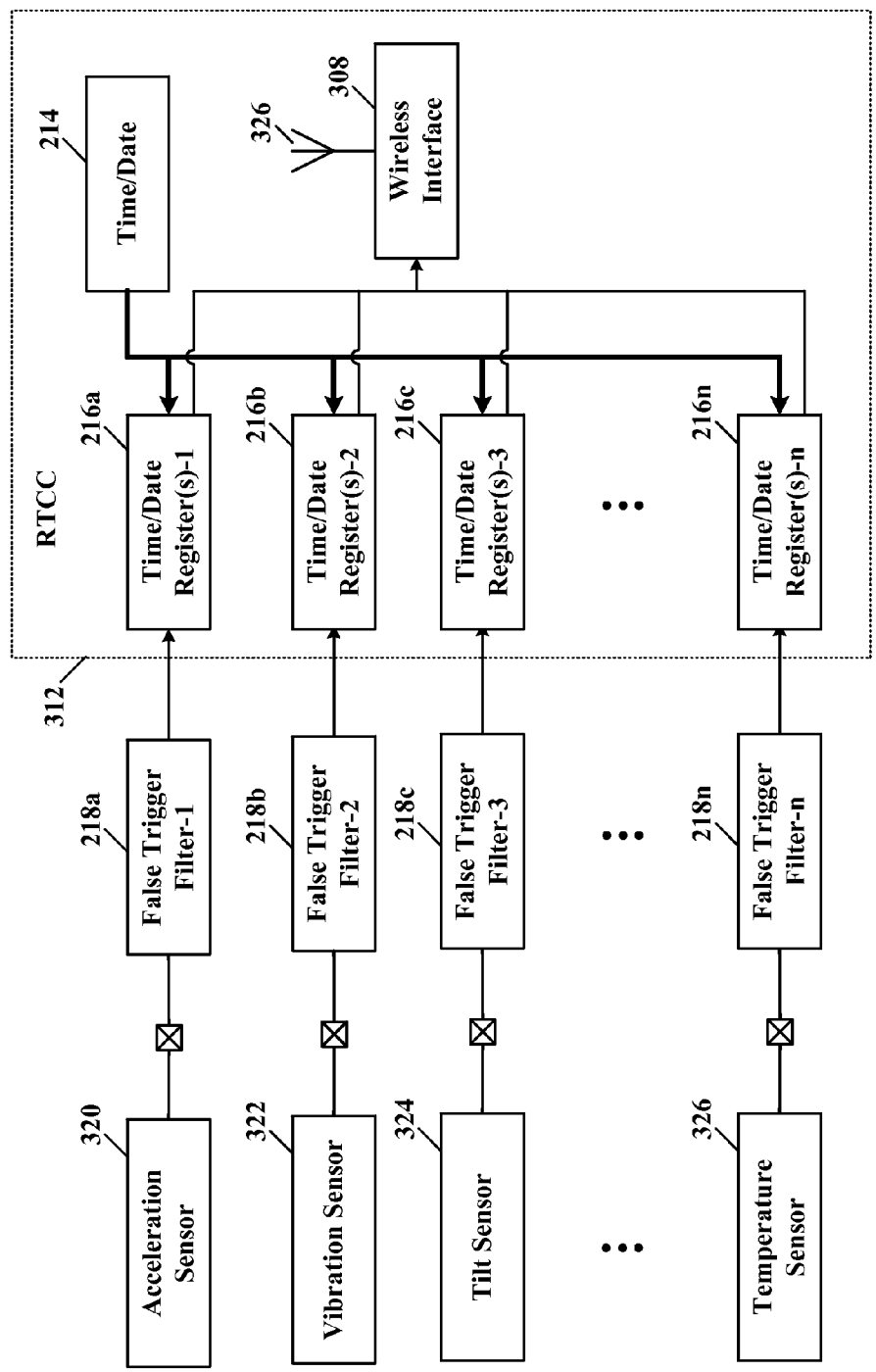
FIG. 3 illustrates a schematic block diagram of a package, shipping container or suitcase having a plurality of tamper and/or mishandling sensors and RTCC time stamping, according to yet another specific example embodiment of this disclosure.

Referring to FIG. 3, depicted is a schematic block diagram of a package, shipping container or suitcase having a plurality of tamper and/or mishandling sensors and RTCC time/date stamping, according to yet another specific example embodiment of this disclosure. Any one or more of a plurality of different sensors 320-326 may be utilized in a package, shipping container or suitcase (not shown) to determine when an undesired event has occurred thereto, e.g., dropping, tipping, excess vibration (bumpy roads), excessive temperature and/or humidity, altitude, ultra violet and infrared sensors, water intrusion, etc. A false trigger filter 218 and time/date stamp register 216 may be coupled with a respective one of the sensors 320-326, and when an undesired event may occur the time and date thereof will be recorded. A wireless interface 308 may also be provided and coupled to the time/date stamp registers 216 for time/date readout therefrom. The communications protocols mentioned hereinabove may be used. An RFID device (not shown) may be coupled to the time/date stamp register(s) 216 for content readout thereof and have an antenna 326.

Figure 4:
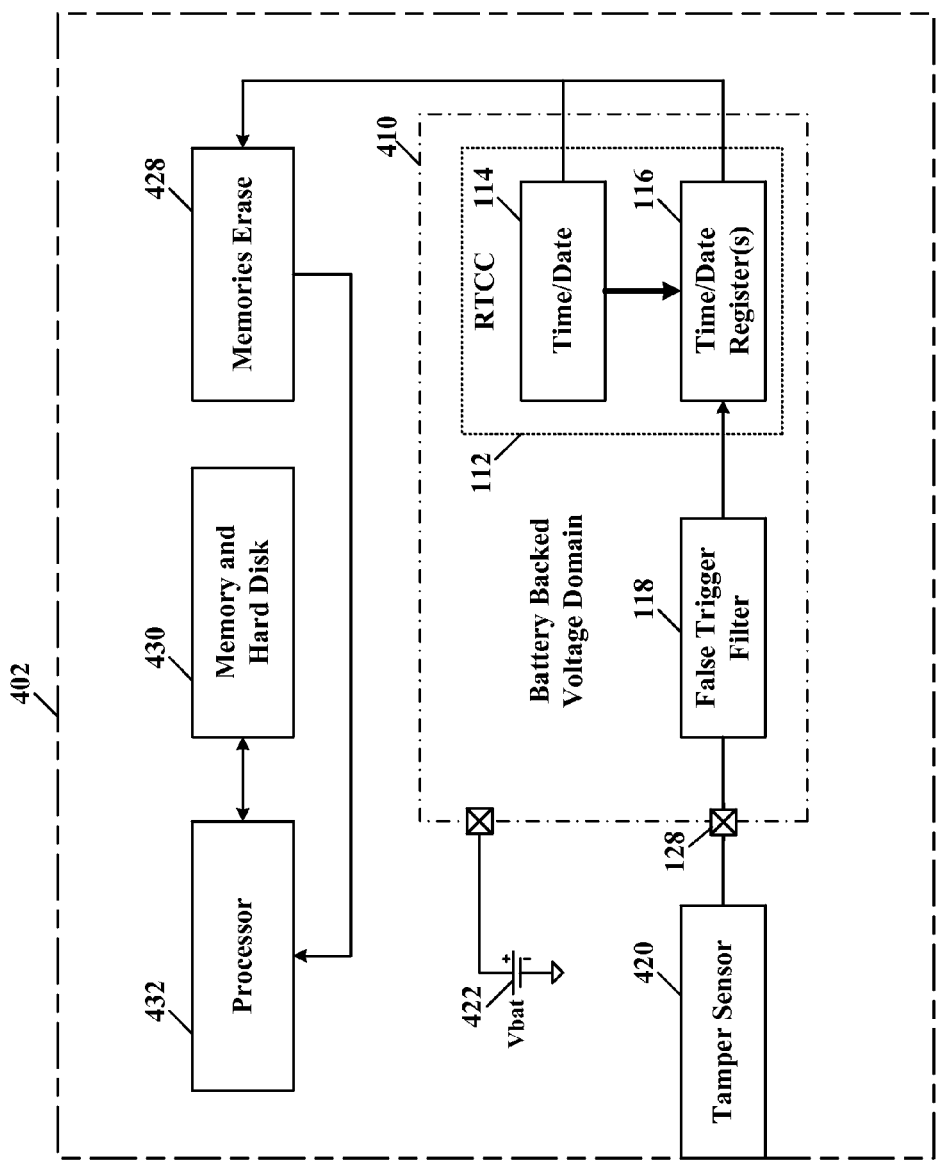
FIG. 4 illustrates a schematic block diagram of a computer system having memories that erase upon a tamper event, according to still another specific example embodiment of this disclosure.

Referring to FIG. 4, depicted is a schematic block diagram of a computer system having memories that erase upon a tamper event, according to still another specific example embodiment of this disclosure. An electronic device 402 has non-volatile memory(ies) 430, e.g., personal computer, tablet, smart phone, bank ATM, and the like, that stores confidential data may prevent this confidential data from being compromised by automatically erasing the confidential data from the memory(ies) 430 thereof. The electronic device 402 may comprise a digital processor 432, a non-volatile memory (hard disk) 430, a memory erase circuit 428, a RTCC 112 comprising a time/date clock 114 and at least one time stamp register 116, a false trigger filter 118, a backup battery 422, and a tamper sensor 420. Upon the occurrence of tamper event detected by the tamper sensor 420 and stored in a time stamp register 116, the memory erase circuit 428 may notify and wake up the digital processor 432 (if necessary) so that the processor 432 may erase all confidential data in the non-volatile memory 430, e.g., hard disk, non-voltage RAM and battery backed-up RAM.

The tamper sensor(s) 120 may be, for example but is not limited to, any one or more of the following sensors: a pressure activated switch, a magnetically activated switch, a mechanically activated switch, a Hall Effect magnetic sensor, a pressure transducer, and/or a capacitive proximity sensor. The mishandling sensor(s) 320 may be, for example but is not limited to, any one or more of the following sensors: an acceleration sensor, a vibration sensor, a tilt sensor, a temperature sensor, a moisture sensor, a pressure sensor, a humidity sensor, an ultraviolet sensor, an infrared sensor, a radiation sensor, and/or an altitude sensor.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An integrated circuit device, comprising:
a real time clock and calendar (RTCC) circuit configured to be coupled with an external power source;
a time stamp capture register coupled with the RTCC; and
an external input coupled with the time stamp capture register for receiving an event signal that initiates capture of time and date information provided by the RTCC into the time stamp capture register; wherein:
the time stamp capture register is a plurality of time stamp capture registers; and
the device further comprises a plurality of false trigger filters, wherein each of the plurality of false trigger filters is coupled to a respective one of the plurality of time stamp capture registers.

2. The integrated circuit device according to claim 1, wherein the time stamp capture register is non-volatile.

3. The integrated circuit device according to claim 1, wherein the time stamp capture register has secured access thereto.

4. The integrated circuit device according to claim 1, further comprising a false trigger filter coupled between the external input and the time stamp capture register.

5. The integrated circuit device according to claim 4, wherein the false trigger filter comprises a low pass filter.

6. The integrated circuit device according to claim 4, wherein the false trigger filter comprises a digital sampling and averaging filter.

7. The integrated circuit device according to claim 1, wherein the RTCC, the time stamp capture register, the external input, and the false trigger filter are powered by a continuous power source.

8. The integrated circuit device according to claim 7, wherein the continuous power source is a battery.

9. The integrated circuit device according to claim 1, further comprising an application circuit and a communications interface coupled with the RTCC and the time stamp capture register.

10. The integrated circuit device according to claim 9, wherein the RTCC, time stamp capture register, and application circuit are provided by a microcontroller.

11. The integrated circuit device according to claim 1, wherein the event signal is a tamper signal from a tamper sensor.

12. The integrated circuit device according to claim 11, wherein the tamper sensor is selected from the group consisting of a pressure activated switch, a magnetically activated switch, a mechanically activated switch, a Hall Effect magnetic sensor, a pressure transducer, and a capacitive proximity sensor.

13. The integrated circuit device according to claim 1, wherein the event signal is a mishandling signal from a mishandling sensor.

14. The integrated circuit device according to claim 13, wherein the mishandling sensor is selected from the group consisting of an acceleration sensor, a vibration sensor, a tilt sensor, a temperature sensor, a moisture sensor, a pressure sensor, a humidity sensor, an ultraviolet sensor, an infrared sensor, a radiation sensor, and an altitude sensor.

15. A metering device having tamper detection, comprising:
a meter housing;
a process metering sensor in the meter housing;
a tamper sensor for detecting tampering of the meter housing; and
an integrated circuit device in the meter housing and comprising a real time clock and calendar (RTCC) circuit configured to be coupled with an external power source;
a time stamp capture register coupled with the RTCC,
an external input coupled with the time stamp capture register for receiving a signal from the tamper sensor that initiates capture of time and date information provided by the RTCC into the time stamp capture register, and
an application circuit coupled to the process metering sensor and the time stamp capture register; wherein:
the time stamp capture register is a plurality of time stamp capture registers; and
the integrated circuit device further comprises a plurality of false trigger filters, wherein each of the plurality of false trigger filters is coupled to a respective one of the plurality of time stamp capture registers.

16. The metering device according to claim 15, wherein the metering device is a utility meter.

17. The metering device according to claim 16, wherein the utility meter is selected from the group consisting of an electric power meter, a natural gas meter, a propane meter, and a water meter.

18. A shipping container having mishandling detection, comprising:
a storage housing;
a mishandling sensor for detecting mishandling of the storage housing; and
an integrated circuit device in the storage housing and comprising
a real time clock and calendar (RTCC) circuit configured to be coupled with an external power source;
a time stamp capture register coupled with the RTCC, and
an external input coupled with the time stamp capture register for receiving a signal from the mishandling sensor that initiates capture of time and date information provided by the RTCC into the time stamp capture register; wherein:
the time stamp capture register is a plurality of time stamp capture registers; and
the integrated circuit device further comprises a plurality of false trigger filters, wherein each of the plurality of false trigger filters is coupled to a respective one of the plurality of time stamp capture registers.

19. The shipping container according to claim 18, wherein the mishandling sensor is selected from the group consisting of an acceleration sensor, a vibration sensor, a tilt sensor, a temperature sensor, a moisture sensor, a pressure sensor, a humidity sensor, an ultraviolet sensor, an infrared sensor, and an altitude sensor.

20. The shipping container according to claim 18, wherein the storage housing is an intermodal steel container.

21. The shipping container according to claim 18, wherein the storage housing is a shipping box.

22. The shipping container according to claim 18, wherein the storage housing is a suitcase.

23. An electronic device having non-volatile memory that is erased when unauthorized access of the electronic device is detected, comprising:
a digital processor;
a non-volatile memory coupled with the digital processor;
a tamper sensor;

a real time clock and calendar (RTCC) circuit configured to be coupled with an external power source;

a time stamp capture register coupled with the RTCC and having an input coupled to the tamper sensor, wherein when a tamper signal is received from the tamper sensor the time stamp capture register stores time and date information provided by the RTCC; and the tamper signal also initiates the digital processor to erase data from the non-volatile memory; wherein:

the time stamp capture register is a plurality of time stamp capture registers; and the device further comprises a plurality of false trigger filters, wherein each of the plurality of false trigger filters is coupled to a respective one of the plurality of time stamp capture registers.

24. The electronic device according to claim 23, wherein the non-volatile memory is a hard disk.

25. The electronic device according to claim 23, wherein the electronic device is selected from the group consisting of a personal computer, a tablet computer, a smart phone, and a bank ATM.

\* \* \* \* \*